US012419018B2

(12) United States Patent
Jung et al.

(10) Patent No.: US 12,419,018 B2
(45) Date of Patent: Sep. 16, 2025

(54) DISPLAY APPARATUS

(71) Applicant: LG Display Co., Ltd., Seoul (KR)

(72) Inventors: Jaeho Jung, Paju-si (KR); Sehwan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 215 days.

(21) Appl. No.: 18/509,886

(22) Filed: Nov. 15, 2023

(65) Prior Publication Data

US 2024/0206137 A1 Jun. 20, 2024

(30) Foreign Application Priority Data

Dec. 15, 2022 (KR) ........................ 10-2022-0175944

(51) Int. Cl.
*H05K 7/20* (2006.01)

(52) U.S. Cl.
CPC ............................... *H05K 7/20963* (2013.01)

(58) Field of Classification Search
CPC ........... H05K 7/20954; H05K 7/20963; H05K 1/189; H05K 7/14; H05K 7/1417; G06F 12/1466
See application file for complete search history.

(56) References Cited

U.S. PATENT DOCUMENTS

| | | | |
|---|---|---|---|
| 6,695,629 B1 * | 2/2004 | Mayer | H05K 7/142 361/752 |
| 7,679,931 B2 * | 3/2010 | Kim | H05K 7/20963 361/753 |
| 8,456,853 B2 * | 6/2013 | Lin | F16B 37/043 361/759 |
| 11,153,997 B2 | 10/2021 | Bang | |
| 2020/0178425 A1 | 6/2020 | Bang | |
| 2020/0209674 A1 * | 7/2020 | Won | H04R 3/12 |
| 2022/0007552 A1 | 1/2022 | Bang | |

FOREIGN PATENT DOCUMENTS

KR 10-2020-0066920 A 6/2020

* cited by examiner

*Primary Examiner* — Jayprakash N Gandhi
*Assistant Examiner* — Matthew Sinclair Muir
(74) *Attorney, Agent, or Firm* — Fenwick & West LLP

(57) ABSTRACT

A display apparatus is disclosed that includes a display panel having front and rear surfaces; a heat dissipation plate having front and rear surfaces and the rear surface of the heat dissipation plate is on the rear surface of the display panel; a source printed circuit board on the rear surface of the heat dissipation plate, and connected to the display panel; a control printed circuit board on the rear surface of the heat dissipation plate and comprising a retaining protrusion that protrudes towards the rear surface of the display panel; and a holder member between the heat dissipation plate and the control printed circuit board and holding the control printed circuit board in the heat dissipation plate. The control printed circuit board is stably held and thus expected to have effects on reducing shaking during logistics transportation and simplifying a manufacturing process.

22 Claims, 13 Drawing Sheets

DISPLAY APPARATUS

CROSS REFERENCE TO RELATED APPLICATION

The present application claims priority to Republic of Korea Patent Application No. 10-2022-0175944, filed on Dec. 15, 2022, which is incorporated by reference in its entirety.

BACKGROUND

Field of the Invention

The disclosure relates to a display apparatus.

Description of the Related Art

A display apparatus may, for example, be a liquid crystal display (LCD) apparatus, an organic light emitting display (OLED) apparatus, an inorganic light emitting display apparatus, etc.

The display apparatus such as the OLED apparatus including a self-emissive device has been widespread to various fields such as a dashboard, a windshield, a mirror display, and indoor and outdoor billboards, etc. of a vehicle as well as traditional electronic devices such as a television (TV). In this case, a use environment for each display apparatus is required to be optimized.

SUMMARY

An aspect of the disclosure is to provide a display apparatus of which a control printed circuit board is stably held to minimize or at least reduce shaking during logistics transportation and simplify a manufacturing process.

It will be appreciated that problems to be solved according to an embodiment of the disclosure are not limited to those mentioned above, and other problems not mentioned will become apparent to those skilled in the art from the following description.

In one embodiment, a display apparatus comprises: a display panel including a front surface and a rear surface that is opposite the front surface; a heat dissipation plate including a front surface and a rear surface, the front surface of the heat dissipation plate on the rear surface of the display panel; a source printed circuit board on the rear surface of the heat dissipation plate, the source printed circuit board connected to the display panel via a flexible circuit board; a control printed circuit board on the rear surface of the heat dissipation plate and connected to the source printed circuit board via a flat cable, the control printed circuit board comprising a retaining protrusion that protrudes towards the rear surface of the display panel; and a holder member between the heat dissipation plate and the control printed circuit board, the holder member including at least one through hole through which the retaining protrusion is inserted.

In one embodiment, a display apparatus comprises: a display panel including a front surface and a rear surface that is opposite the front surface; a heat dissipation plate including a front surface and a rear surface and the front surface of the heat dissipation plate is on the rear surface of the display panel, the heat dissipation plate configured to dissipate heat from the display panel; a holder frame on the heat dissipation plate, the holder frame including a plurality of through holes; and a control printed circuit board on the holder frame, the control printed circuit board including a plurality of retaining protrusions that are each inserted into a corresponding through hole from the plurality of through holes and in contact with at least a portion of the corresponding through hole such that the control printed circuit board is connected to the holder frame.

According to an embodiment of the disclosure, a control printed circuit board is stably held to minimize or at least reduce shaking during logistics transportation, thereby preventing or at least reducing damage and noise.

Further, a tape for holding is not used, thereby reducing manufacturing costs.

Further, a control printed circuit board is provided to a customer as it has already been held in the heat dissipation plate without a repetitive screw fastening process, thereby simplifying an assembly process.

According to an embodiment of the disclosure, a display apparatus is prevented from defects such as shaking of a printed circuit board, thereby enhancing a yield and optimizing a process based on less consumption of production energy.

According to an embodiment of the disclosure, a space for dissipating heat is formed in a holder frame of a display apparatus to improve heat dissipation, thereby reducing operation failure due to heat and providing a low-power display apparatus.

The foregoing problems to be solved, the means for solving the problems, and the effects do not specify the essential features of claims, and thus the scope of the claims is not limited by the matters disclosed herein.

DETAILED DESCRIPTION

Figure 1:
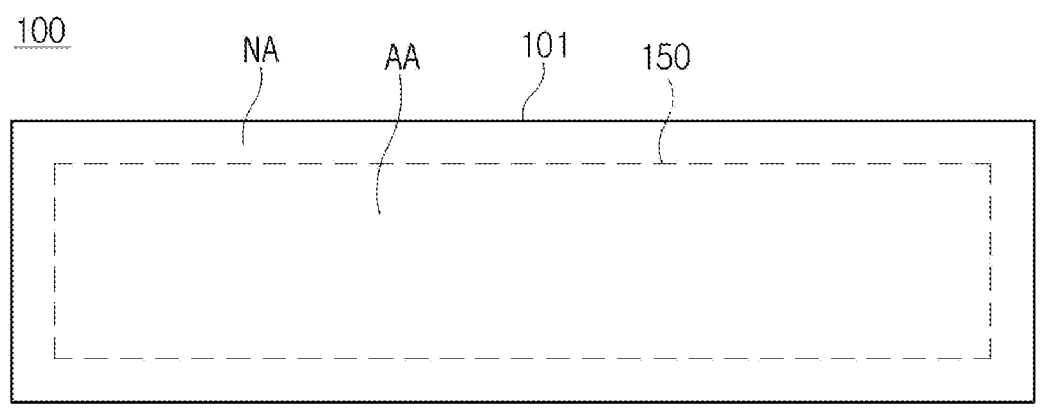
FIG. 1 is a diagram showing the front of a display apparatus according to an embodiment of the disclosure.

Advantages and features of the disclosure and methods of accomplishing the same may be understood more readily by reference to the detailed description of embodiments that will be made hereinafter with reference to the accompanying drawings. The disclosure may, however, be embodied in many different forms and should not be construed as being limited to the exemplary embodiments set forth herein; rather, these exemplary embodiments are provided so that the disclosure will be thorough and complete and will fully convey the concept of the invention to those skilled in the art, and the present invention will only be defined by the appended claims.

The shapes, sizes, ratios, angles, numbers and the like illustrated in the drawings to describe embodiments of the disclosure are merely exemplary, and thus, the disclosure is not limited thereto. Throughout the specification, the same reference numerals refer to the same components. In addition, detailed descriptions of well-known technologies may be omitted in the disclosure to avoid obscuring the subject matter of the disclosure. When terms such as "comprises," "has," "includes," or "is made up of" are used in this specification, it should be understood that unless "only" is specifically used, additional elements or steps can be included. Unless otherwise explicitly stated, when a component is expressed in the singular form, it is intended to encompass the plural form as well.

In interpreting the components, it is construed to include a margin of error even in the absence of explicit description.

When describing the positional relationship, for example, when the relationship between two parts is described as "on", "on top of", "underneath", "beside", etc., unless "directly" or "immediately" is used, one or more other parts may be located between the two parts.

When a device or layer is referred to as being "on" another device or layer, it includes cases where one device or layer is directly located on the other device or layer or still other device or layer is interposed between the two devices or layers.

Although the terms "first", "second", and the like are used to describe various components, these components are not limited by these terms. These terms are merely used for distinguishing one component from the other components. Therefore, the first component mentioned hereinafter may be the second component in the technical sense of the disclosure.

Throughout the specification, the same reference numerals refer to the same components.

The sizes and thicknesses of each component shown in the drawings are presented for the convenience of description and are not intended to limit the disclosure.

The features of various embodiments of the disclosure can be partially or entirely combined or assembled in various technical manners of interlocking and interoperation obvious to those skilled in the art, and each embodiment can be implemented independently or in combination with related embodiments.

Hereinafter, detailed descriptions are made of the embodiments of the disclosure with reference to the accompanying drawings.

In the disclosure, the term "display apparatus" is used in a narrow sense to refer to display apparatuses, such as a liquid crystal module (LCM), an organic light-emitting diode (OLED) module, and a quantum dot module, each including a display panel and a panel driving unit to operate the display panel. In addition, the term may also be used to refer to set electronic devices, set devices, or apparatuses that include LCMs, OLED modules, QD modules, and the like, such as equipment display apparatuses including complete or final products such as laptop computers, televisions, computer monitors, automotive displays or equipment displays provided in other forms for vehicles, as well as mobile electronic devices such as smartphones or electronic pads.

Accordingly, in the disclosure, the display apparatus may include not only the display apparatuses in the narrow sense themselves, such as LCMs, OLED modules, QD modules, but also set devices as application products or final consumer devices including LCMs, OLED modules, QD modules, and the like.

Additionally, in some cases, an LCM, an OLED module, or a QD module, composed of a display panel and a panel driving unit may be referred to as a "display apparatus" in a narrow sense, while an electronic device as a complete product including an LCM, an OLED module, or a QD module may be referred to as "set device". For example, the narrow-sense display apparatus may include a display panel of liquid crystal (LCD), organic light-emitting diode (OLED), or quantum dot (QD) and a source printed circuit board (PCB) as a control unit for driving the display panel, while a set device may further include a set PCB, serving as a set control unit that is electrically connected to the source PCB and controls the entire set device.

The display panel used in the embodiments may include all types of display panels such as liquid crystal display panels, organic light-emitting diode (OLED) display panels, quantum dot (QD) display panels, and electroluminescent display panels, and is not limited to a specific display panel capable of bending a bezel with a flexible substrate for the OLED display panel and a backplate support structure thereunder. In addition, the display panel used in the embodiments of the disclosure is not limited to the shape or size of the display panel.

For example, when the display panel is an organic light-emitting diode (OLED) display panel, it may include a plurality of gate lines and data lines and pixels formed at the intersection of the gate lines and data lines. In addition, it may be configured to include an array including thin-film transistors as components for selectively applying a voltage to each pixel, an organic light-emitting diode (OLED) layer on the array, an encapsulation substrate or encapsulation layer arranged on the array to cover the organic light-emitting diode layer, etc. The encapsulation layer may protect the thin film transistors and the organic light-emitting device layer from external impacts and prevent moisture or oxygen from penetrating the organic light-emitting device layer. In addition, the layers formed on the array may, for example, include an inorganic light-emitting layer, such as a nano-sized material layer or quantum dots.

In the disclosure, FIG. 1 illustrates an exemplary organic light emitting diode (OLED) display panel that may be integrated within display apparatuses.

FIG. 1 is a diagram illustrating the front of a display apparatus 100 according to an embodiment of the disclosure.

With reference to FIG. 1, the display apparatus 100 may be applied to the center fascia of a vehicle. Although FIG. 1 shows a rectangular display panel 150, the shape of the display apparatus 100 is not necessarily limited thereto and can be produced in various shapes such as squares, polygons, or curves.

Referring to FIG. 1, the display apparatus 100 is equipped with integrated display and touch functions, and the cover member 101 is attached to the front. A display panel 150 for displaying may be arranged on the back surface of the cover member 101. The display apparatus 100 may be inserted and coupled to the dashboard of a vehicle, for example. The display panel 150 may be made on a substrate of a rigid material, but in the case of organic light-emitting devices, it may also be made on a flexible substrate. A display panel 150 made on a flexible substrate may be deformed concavely or convexly depending on the shape of the dashboard, allowing for flexible design. The cover member 101 may be a cover glass.

Figure 2:
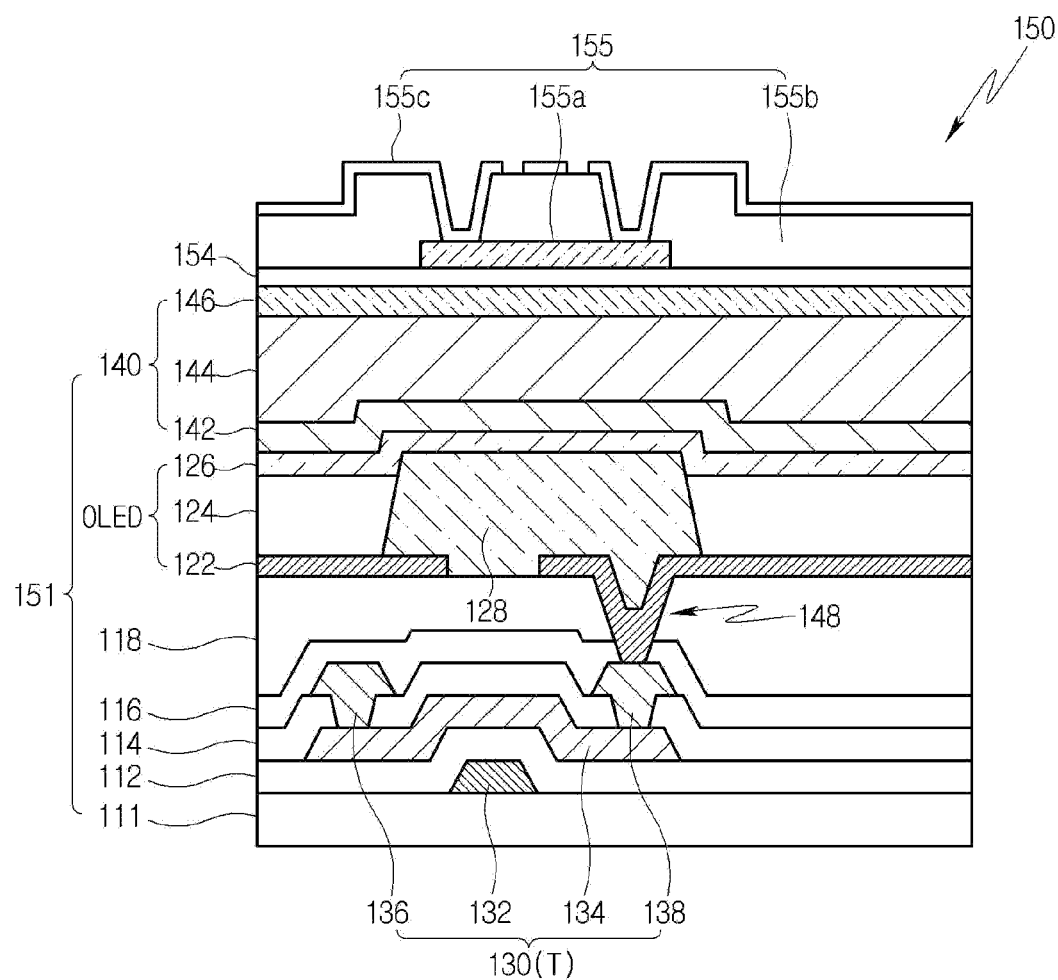
FIG. 2 is a diagram showing a cross section of a light emitting device according to an embodiment of the disclosure.

FIG. 2 shows the cross-sectional structure of the light emitting device provided in the display panel of FIG. 1 according to one embodiment. The substrate 111 may support various components of the display panel 150. The substrate 111 may be formed of a transparent dielectric material such as glass, plastic, and the like. In the case of being made of plastic, the substrate 111 may be a plastic film or a plastic substrate. For example, the substrate 111 may take the form of a film including one of the polyimide-based polymers, polyesters-based polymers, silicone-based polymers, acrylic-based polymers, polyolefin-based polymers, and their copolymers. Among these materials, polyimide is mainly used as a plastic substrate because it is suitable for high-temperature processes and is a material that can be coated.

A buffer layer may be positioned on the substrate 111. The buffer layer is a functional layer that protects the thin film transistor (TFT) from impurities such as alkali ions that may leak from the bottom of the substrate 111. The buffer layer may be formed of silicon oxide (SiOx), silicon nitride (SiNx), or multiple layers thereof.

Thin film transistor 130 may be disposed on the buffer layer. The thin film transistor 130 may be formed by sequentially arranging a gate electrode 132, a gate insulating layer 112, a semiconductor layer 134, an interlayer insulating film 114, a source electrode 136 and a drain electrode 138 on the buffer layer. There may be one or more thin film transistors 130 arranged for a plurality of sub-pixels provided in the active area.

Although illustrated as the bottom-gate type in FIG. 2, the thin film transistor 130 is not limited thereto and may also be provided as the top-gate type, in which the order of the semiconductor layer 134 and the gate electrode 132 are reversed. The disclosure is not limited thereto.

The semiconductor layer 134 may be arranged at a specific portion on the substrate 111 or on the buffer layer. The semiconductor layer 134 may be made of polycrystalline silicon (p-Si), and in this case, a region of the semiconductor layer 134 may be doped with impurities to form the electrode layer. The semiconductor layer 134 may also be made of amorphous silicon (a-Si) and various organic semiconductor materials such as pentacene. Furthermore, the semiconductor layer 134 may also be made of an oxide material. The gate insulating layer 112 may be formed of inorganic dielectric materials such as silicon oxide (SiOx) or silicon nitride (SiNx) and organic dielectric materials. The gate electrode 132 may be formed of various conductive materials, such as magnesium (Mg), aluminum (Al), nickel (Ni), chromium (Cr), molybdenum (Mo), tungsten (W), gold (Au), or alloys thereof.

The first interlayer insulating film 114 may be formed of inorganic dielectric materials such as silicon oxide (SiOx) or silicon nitride (SiNx) and, organic dielectric materials. The first interlayer insulating film 114 may be selectively removed to form contact holes exposing the source and drain regions.

The source and drain electrodes 136 and 138 are formed as a single layer or multilayer of electrode material on the first interlayer insulating film 114.

An inorganic protective film 116 and a planarization layer 118 may be positioned on the thin film transistor 130 to cover the source and drain electrodes 136 and 138. The inorganic protective film 116 and the planarization layer 118 protect the thin film transistor 130 and flatten its upper surface.

The inorganic protective film 116 may be formed of inorganic dielectric films such as silicon nitride (SiNx) and silicon oxide (SiOx), while the planarization layer 118 may be made of organic dielectric films such as Benzocyclobutene (BCB) or acrylic (Acryl). The inorganic protective film 116 and the planarization layer 118 may each be formed as a single layer, dual-layer, or multilayer structure, and in some cases, one of the two layers may be omitted.

A light-emitting component OLED connected to the thin film transistor (TFT) 130 may be formed by sequentially arranging a first electrode 122, an organic light-emitting layer 124, and a second electrode 126. That is, the light-emitting component OLED may be composed of the first electrode 122 connected to the drain electrode 138 through a connection hole 148 formed in the planarization layer 118 and the inorganic protective film 116, the organic light emitting layer 124 positioned on the first electrode 122, and the second electrode 126 positioned on the organic light-emitting layer 124.

When the display panel 150 is of a top emission type where the emission occurs upward through the second electrode 126, the first electrode 122 may include an opaque conductive material with high reflectivity. In this case, examples of reflective conductive material may include silver (Ag), aluminum (Al), gold (Au), molybdenum (Mo), tungsten (W), chromium (Cr), or alloys thereof.

A bank 128 is formed in the area excluding the light-emitting area, opening up the light-emitting area. Accordingly, the bank 128 has a bank hole exposing the first electrode 122 corresponding to the light-emitting area. The bank 128 may be made of inorganic dielectric materials such as silicon nitride (SiNx), silicon oxide (SiOx), or organic dielectric materials such as BCB, acrylic-based resins, or imide-based resins.

The organic light-emitting layer 124 is positioned on the first electrode 122 exposed by the bank 128. The organic light-emitting layer 124 may include a hole injection layer, a hole transport layer, an emissive layer, an electron transport layer, and an electron injection layer. In addition, the organic light-emitting layer 124 may be composed of a single emissive layer structure that emits a single light within a single stack, or a multi-stack structure including multiple stacks, each of which includes a single emissive layer of the same color. In such cases, adjacent sub-pixels may be arranged to emit different colors of light to display various colors. For example, sub-pixels with emissive layers of red, green, and blue may be arranged in a row or spaced apart from each other and, as well, in a triangle shape or pentile structure with some sub-pixels of predetermined colors aligned parallel and others aligned diagonally to each other.

In some cases, sub-pixels of white color may also be added to the arrangement. In addition, the organic light-emitting layer 124 may be configured by stacking a plurality of stacks including emissive layers emitting different colors of light to express white. In the case of expressing white with a stacked structure, separate color filters may be additionally added to each sub-pixel.

The second electrode 126 is position on the organic light-emitting layer 124. When the display panel 150 adopts a top emission structure, the second electrode 126 may be formed of a transparent conductive material such as indium tin oxide (ITO) or indium zinc oxide (IZO) or a semi-transparent metal or metal alloy such as Mg and Ag to emit light generated in the organic light-emitting layer 124 upward through the second electrode 126.

The second electrode 126 may be arranged to reach a capping layer. The capping layer may protect the OLED and assist in the extraction of light emitted through the second electrode 126 by using a material with a high refractive index.

An encapsulation layer 140 may be disposed on the light-emitting component OLED. The encapsulation layer 140 prevents or at least reduces the infiltration of oxygen and moisture from the outside, preventing oxidation of the emissive and electrode materials. Exposure of OLED to moisture or oxygen may cause pixel shrinkage or the formation of dark spots, reducing the emitting area. The encapsulation layer 140 is formed by alternately stacking inorganic layers 142 and 146 made of glass, metal, aluminum oxide (AlOx), or silicon (Si) materials and an organic layer 144 that serves as a buffer relieving the stress between layers due to the bending of the display panel (150 in FIG. 1) and enhances the flattening performance. The organic layer 144 may be made of organic dielectric materials such as acrylic resin, epoxy resin, polyimide, polyethylene, or silicon oxycarbide (SiOC). Here, the first and second inorganic layers 142 and 146 serve to block the penetration of moisture or oxygen, while the organic layer 144 flattens the surface of the first inorganic layer 142. The encapsulation layer 140 is composed of several thin film layers to increase the length and complexity of the path that moisture and oxygen must travel compared to a single layer, with the purpose of making it difficult for moisture and oxygen to penetrate to the light-emitting component OLED.

A protective layer may be formed further between the light-emitting component OLED and the encapsulation layer 140 to protect the encapsulation layer 140 from being peeled off or affecting the uniformity during the manufacturing process of the encapsulation layer 140.

With reference to FIG. 2, a touch buffer layer 154 may be disposed on the encapsulation layer 140. The touch buffer layer 154 may minimize or at least reduce the impact of light entering the display panel 150 from external light sources on the semiconductor layer 134 or the organic light-emitting layer 124.

With reference to FIG. 2, a touch sensor layer 155 may be arranged on the touch buffer layer 154. The touch sensor layer 155 may be structured with the first touch electrode 155a and the second touch electrode 155c intersecting each other, allowing one electrode to receive an applied voltage signal and the other to sense the voltage signal. The first touch electrode 155a and the second touch electrode 155c may be patterned into polygonal or circular shapes on a touch insulation film 155b to be arranged at a distance from each other.

The cover member 101 may be disposed on the touch sensor layer 155 (not shown in FIG. 2).

Figure 3:
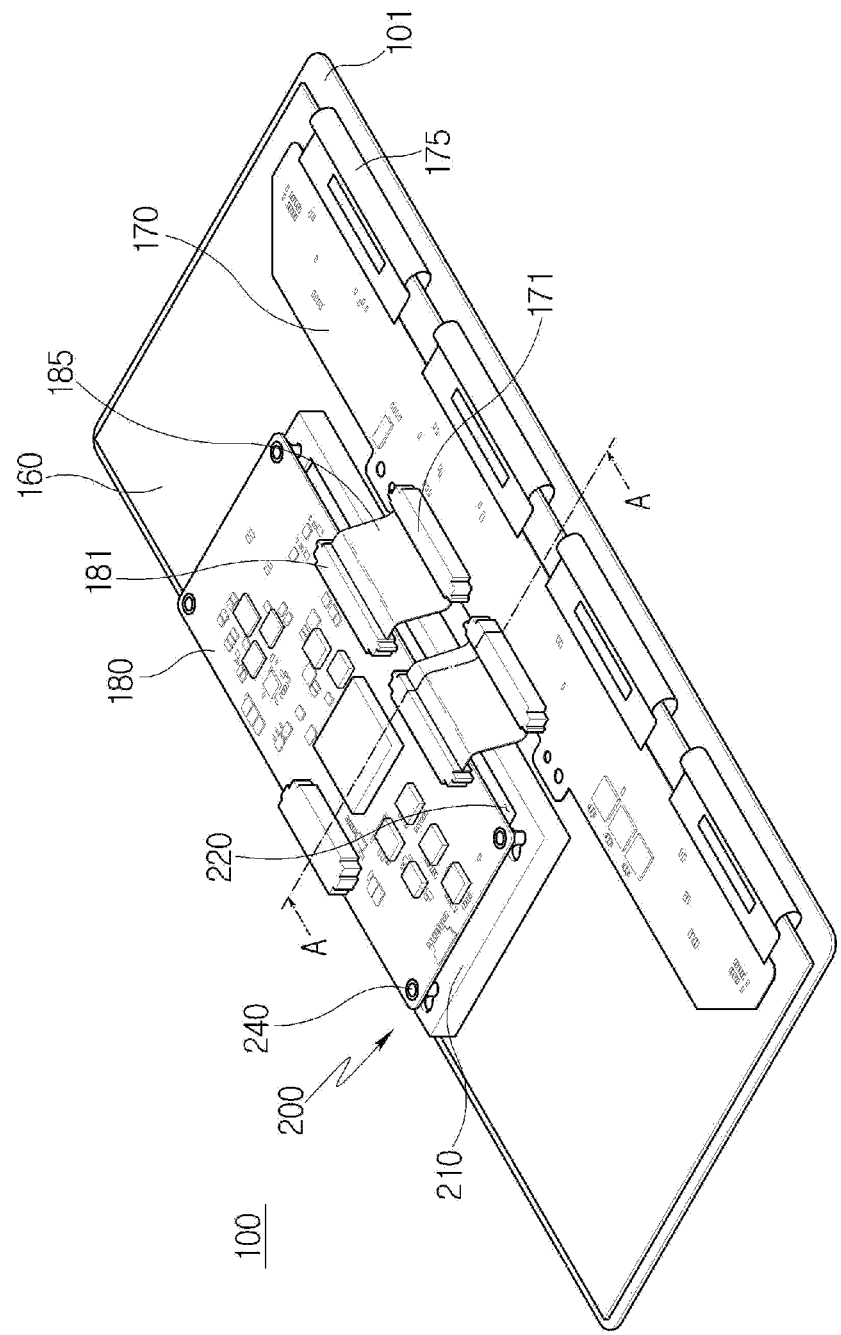
FIG. 3 is a perspective view showing the rear of a display apparatus according to an embodiment of the disclosure.
Figure 4:
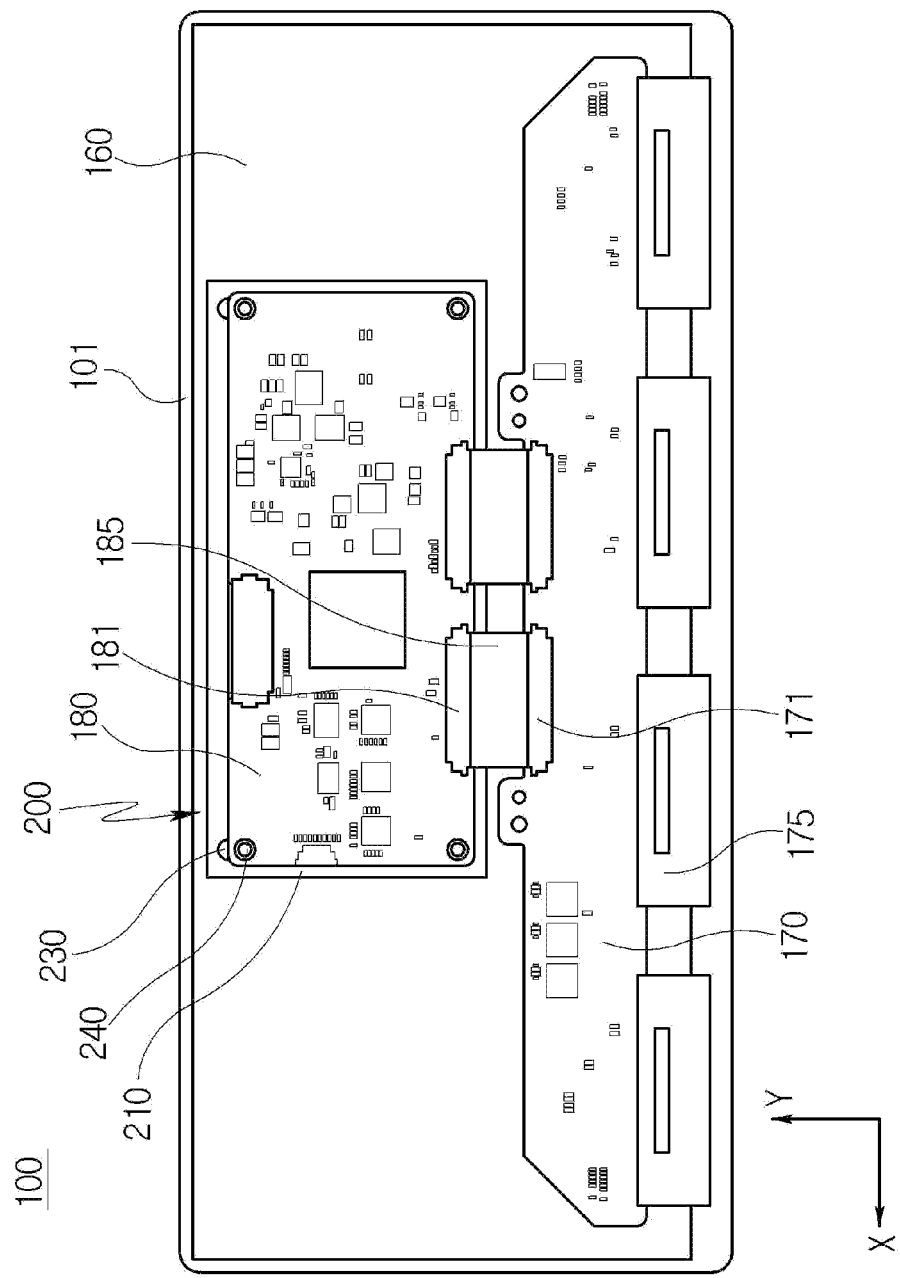
FIG. 4 is a plan view showing the rear of a display apparatus according to an embodiment of the disclosure.

FIGS. 3 and 4 shows the rear of the display apparatus 100 according to an embodiment of the disclosure.

FIG. 3 is a perspective view showing the rear of a display apparatus according to an embodiment of the disclosure.

FIG. 4 is a plan view showing the rear of a display apparatus according to an embodiment of the disclosure.

Referring to FIGS. 1, 3 and 4, the display apparatus 100 may include a cover member 101, a display panel 150, a heat dissipation plate 160, a source printed circuit board 170, a control printed circuit board 180, and a holder member 200.

The cover member 101 may include an active area AA (see FIG. 1) and an inactive area NA (see FIG. 1). The source printed circuit board 170 may be attached to the back surface of the display panel 150. The heat dissipation plate 160 may be disposed between a rear surface of the display panel 150 that is opposite a front surface of the display panel 150 and the source printed circuit board 170. The heat dissipation plate 160 may be provided to dissipate the heat generated in the display panel to the rear of the display panel.

The source printed circuit board 170 and the display panel 150 may be connected through a flexible circuit board 175 such that the source printed circuit board 170 can operate the display panel 150. The flexible circuit board 175 may be a flexible circuit, a chip on film (COF), or the like.

The control printed circuit board 180 and the source printed circuit board 170 may be connected through a flat cable 185 such that the control printed circuit board 180 can operate the source printed circuit board 170. Here, the source printed circuit board 170 may be provided with a pair of first connectors 171, and the control printed circuit board 180 may be provided with a pair of second connectors 181. The flat cable 185 may be connected to the first connector 171 and the second connector 181 to connect together the control printed circuit board 180 and the source printed circuit board 170.

The heat dissipation plate 160 may be disposed on the back surface of the display panel 150 to dissipate the heat generated by the display panel 150. In an embodiment of the disclosure, the heat dissipation plate 160 is an aluminum plate, but is not limited thereto.

The holder member 200 may be disposed between the heat dissipation plate 160 and the control printed circuit board 180. The holder member 200 may be disposed in connection with the heat dissipation plate 160 and the control printed circuit board 180, so that the control printed circuit board 180 can be coupled to the heat dissipation plate 160.

The control printed circuit board 180 may include a retaining protrusion 240 in one embodiment.

The holder member 200 may include a holder frame 210 and a through hole 230. In one embodiment, the retaining protrusion 240 passes through the through hole 230.

The holder member 200 may be disposed on the rear of the heat dissipation plate 160.

Referring to FIG. 4, the holder frame 210 may be shaped corresponding to the control printed circuit board 180. According to an embodiment of the disclosure, the control printed circuit board 180 is shaped like a quadrangular plate, and thus the holder frame 210 is shaped like a corresponding quadrangular plate. That is, the control printed circuit board 180 and the holder frame 210 have a same shape.

Figure 5A:
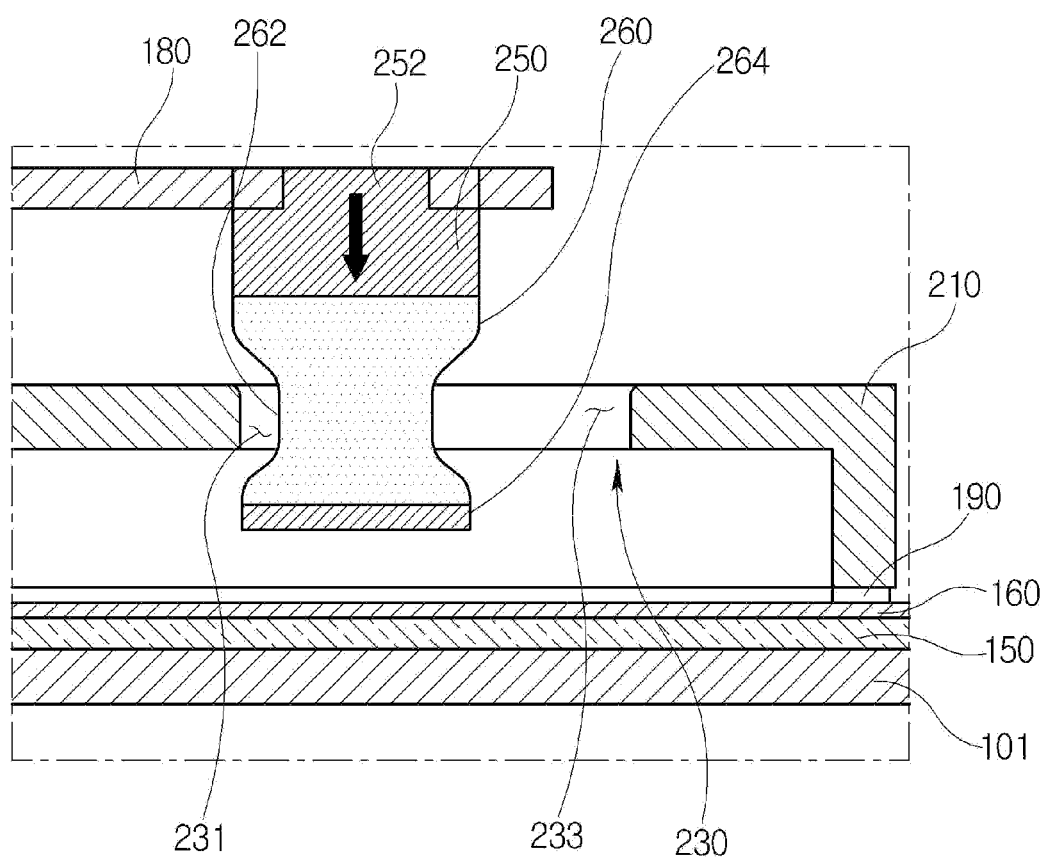
FIG. 5A is a cross-sectional view showing a portion in which a second protrusion is inserted in an insertion hole in a holder member according to an embodiment of the disclosure.

The holder frame 210 may be implemented with a non-conductive and highly rigid material and disposed being adhered to the rear of the heat dissipation plate 160 by an adhesive member 190 (see FIG. 5a). For example, the holder frame 210 may be made of a plastic material, a ceramic material, or the like material, and may also be made of other materials.

Figure 7:
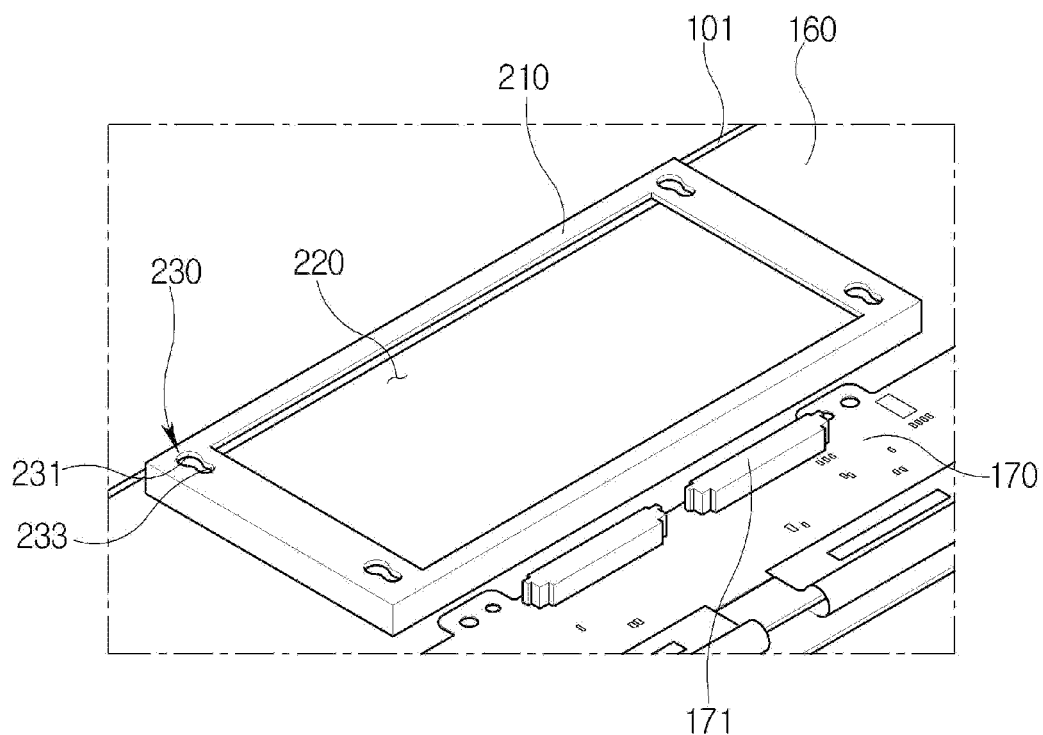
FIG. 7 is a perspective view of a holder frame according to an embodiment of the disclosure.

FIG. 7 is a perspective view of a holder frame according to an embodiment of the disclosure.

Referring to FIG. 7, the holder frame 210 may be formed with an opening 220 and the through hole 230 thereon. The holder member 200 may include the holder frame 210 including the through hole 230. In one embodiment, the holder frame 210 includes a plurality of through holes 230 that are each disposed at a corner of the holder frame 210.

The opening 220 may be formed by penetrating though an entire thickness of a center portion of the holder frame 210. In this case, the opening 220 may be formed on the holder frame 210 in an area corresponding to (e.g., overlapping) the control printed circuit board 180. While the display apparatus 100 is operating, the control printed circuit board 180 may generate heat. When the center portion of the holder frame 210 is blocked, heat does not dissipate and the control printed circuit board 180 heats up. This may deteriorate the performance of the display apparatus 100.

Figure 8:
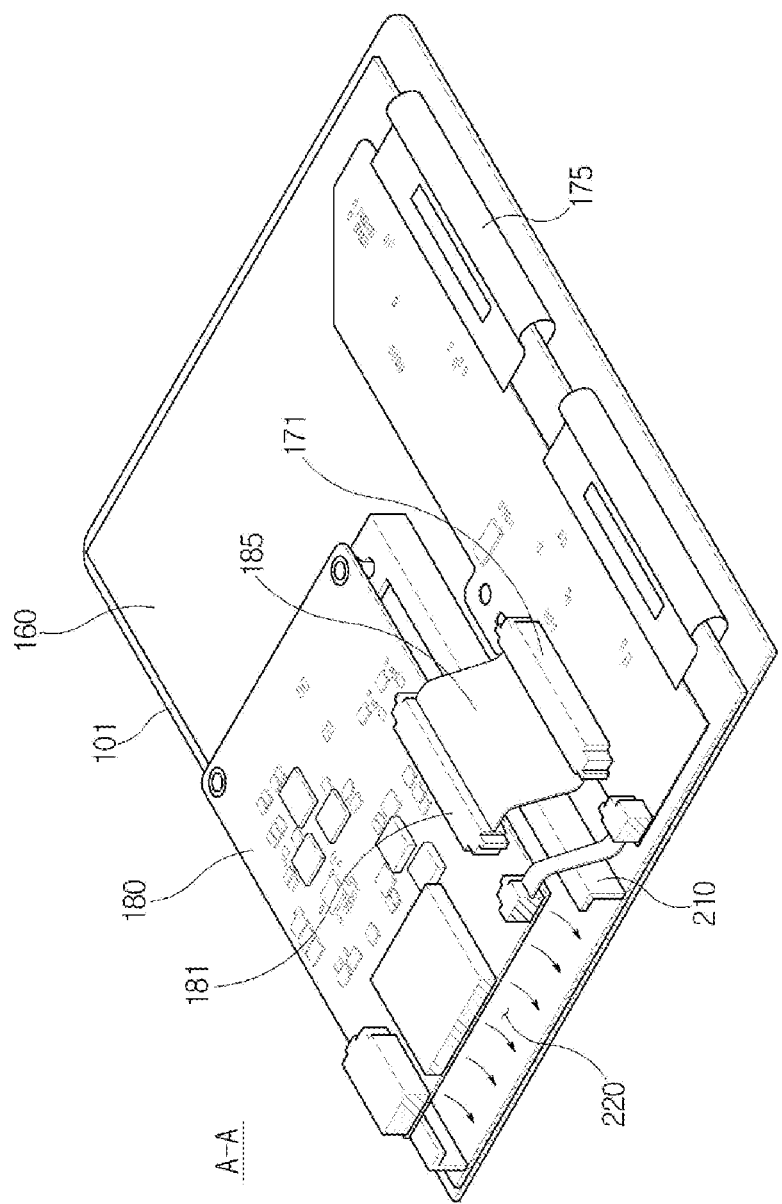
FIG. 8 shows a cross-sectional structure taken along line A-A of FIG. 3 according to an embodiment of the disclosure.

FIG. 8 shows a perspective view of a cross-sectional structure taken along line A-A of FIG. 3 showing the rear of the display apparatus according to one embodiment.

Referring to FIG. 8, heat generated by the control printed circuit board 180 is indicated by the arrows. The heat is introduced into the inside of the holder frame 210 through the opening 220 formed in the center portion of the holder frame 210. In this way, the holder frame 210 has a space to which heat is released (e.g., dissipated), and the heat dissipation plate 160 having high thermal conductivity is disposed so that heat generated in the control printed circuit board 180 can be easily dissipated to the outside by heat conduction in the heat dissipation plate 160. The opening 220 forms an air gap between the control printed circuit board 180 and the heat dissipation plate 160 therein to prevent the heat generated in the control printed circuit board 180 from being transferred to the display panel 150, thereby having an insulating effect. Accordingly, operation failure due to overheating is reduced.

Referring to FIG. 7, the through hole 230 may be disposed through an entire thickness of the holder frame 210. In this case, a plurality of through holes 230 may be disposed on the edges of the holder frame 210. According to an embodiment of the disclosure, four through holes 230 are disposed to stably hold the edges of the control printed circuit board 180, but not limited thereto.

Referring to FIGS. 5A to 7 and 9 to 11, the through hole 230 according to an embodiment of the disclosure may include an insertion hole 231, a holding portion 236, and a retaining hole 233.

FIG. 5A is a cross-sectional view showing a portion in which a second protrusion is inserted in an insertion hole in a holder member 210 according to an embodiment of the disclosure.

Figure 5B:
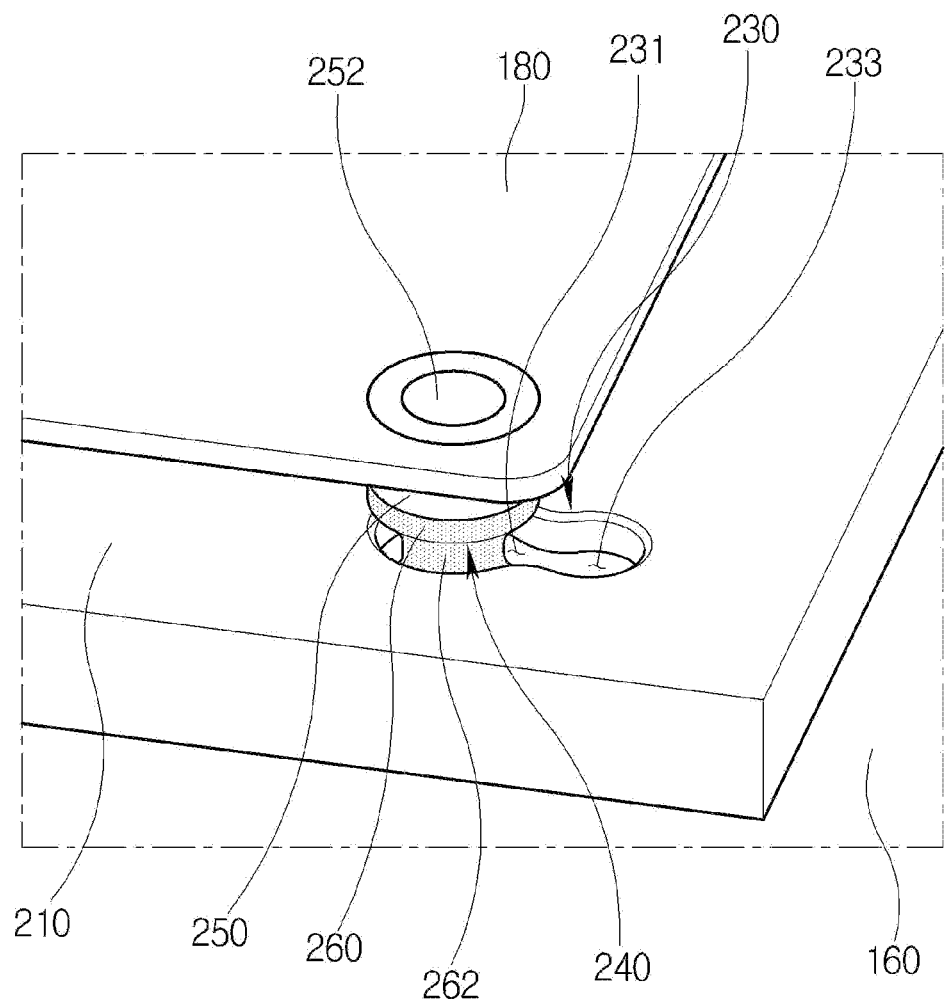
FIG. 5B is a perspective view showing a portion in which a second protrusion is inserted in an insertion hole in a holder member according to an embodiment of the disclosure.

FIG. 5B is a perspective view showing a portion in which a second protrusion is inserted in an insertion hole in a holder member according to an embodiment of the disclosure.

Figure 6A:
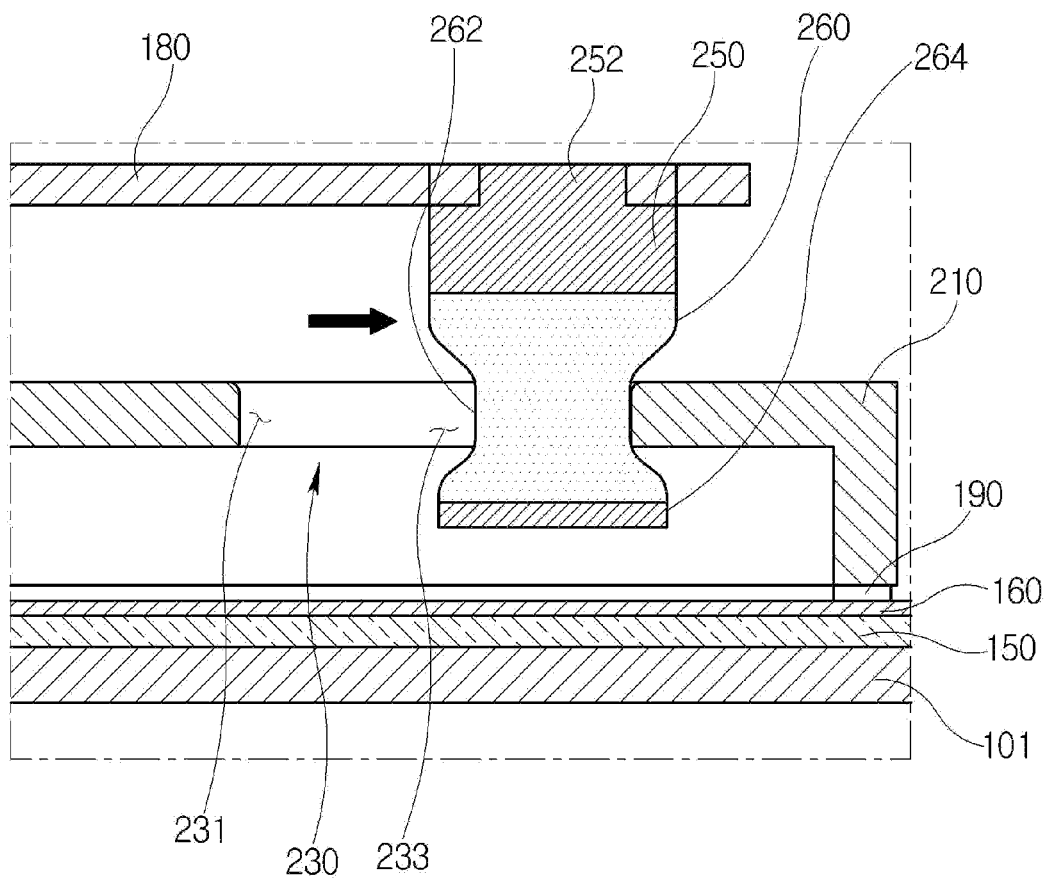
FIG. 6A is a cross-sectional view showing that a recessed portion is inserted in a retaining hole in a holder member according to an embodiment of the disclosure.

FIG. 6A is a cross-sectional view showing that a recessed portion is inserted in a retaining hole in a holder member according to an embodiment of the disclosure.

Figure 6B:
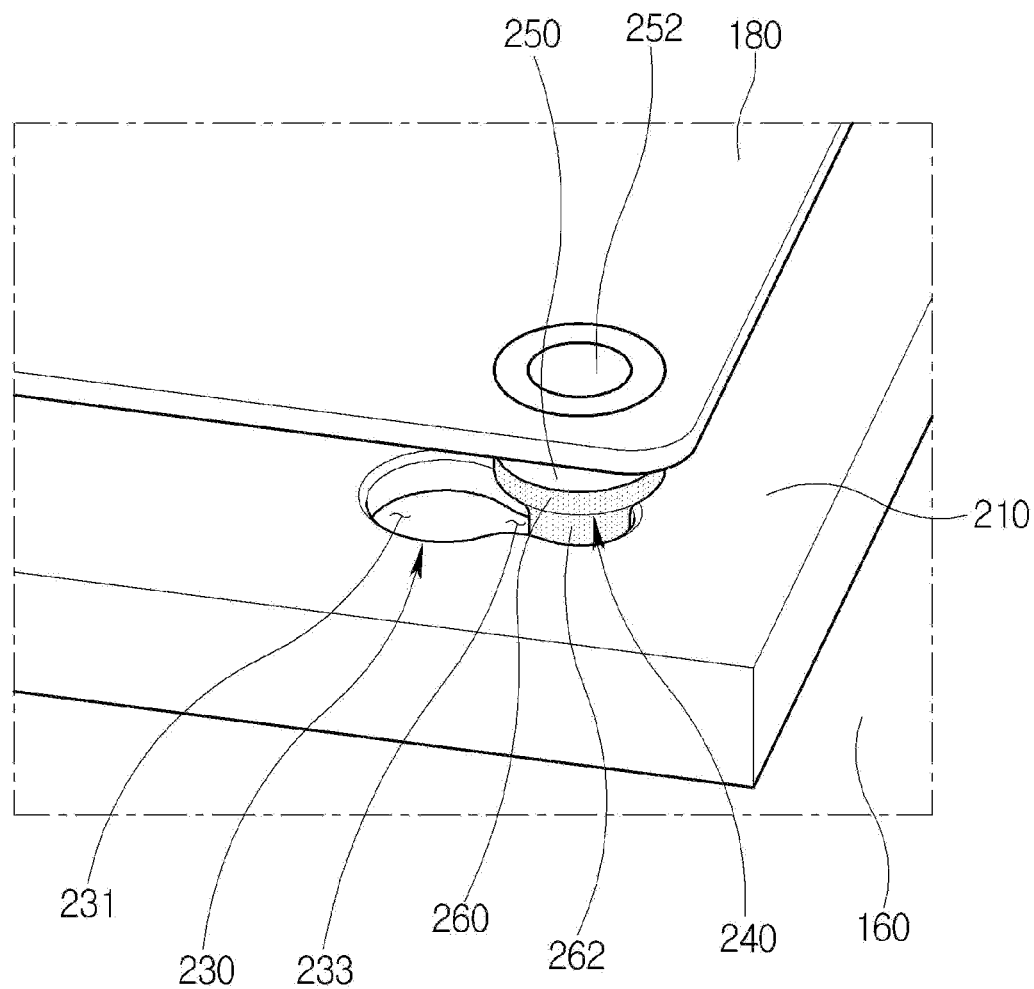
FIG. 6B is a perspective view showing that a recessed portion is inserted in a retaining hole in a holder member according to an embodiment of the disclosure.

FIG. 6B is a perspective view showing that a recessed portion is inserted in a retaining hole in a holder member according to an embodiment of the disclosure.

Figure 9:
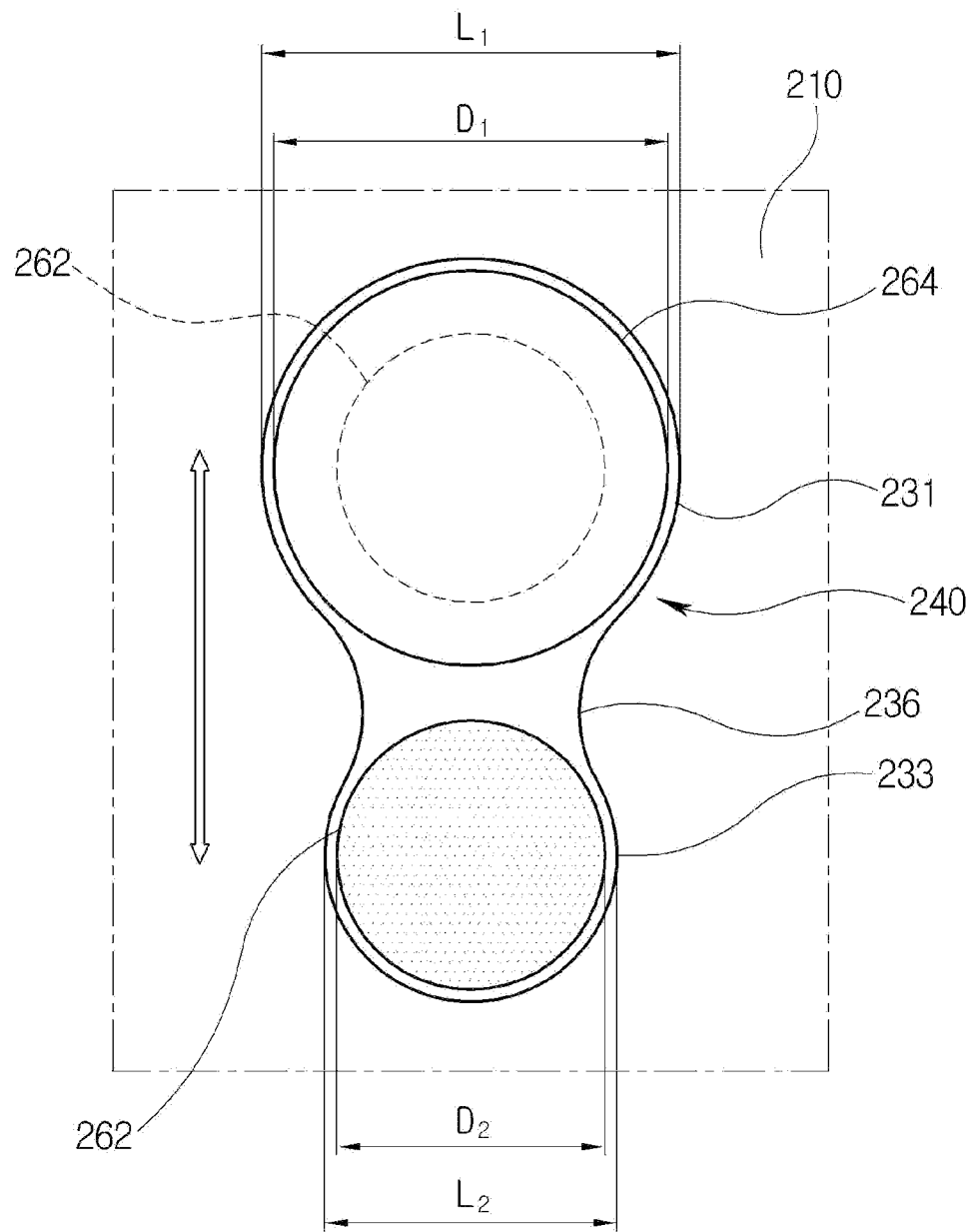
FIG. 9 is a plan view of a holder member according to an embodiment of the disclosure.
Figure 10:
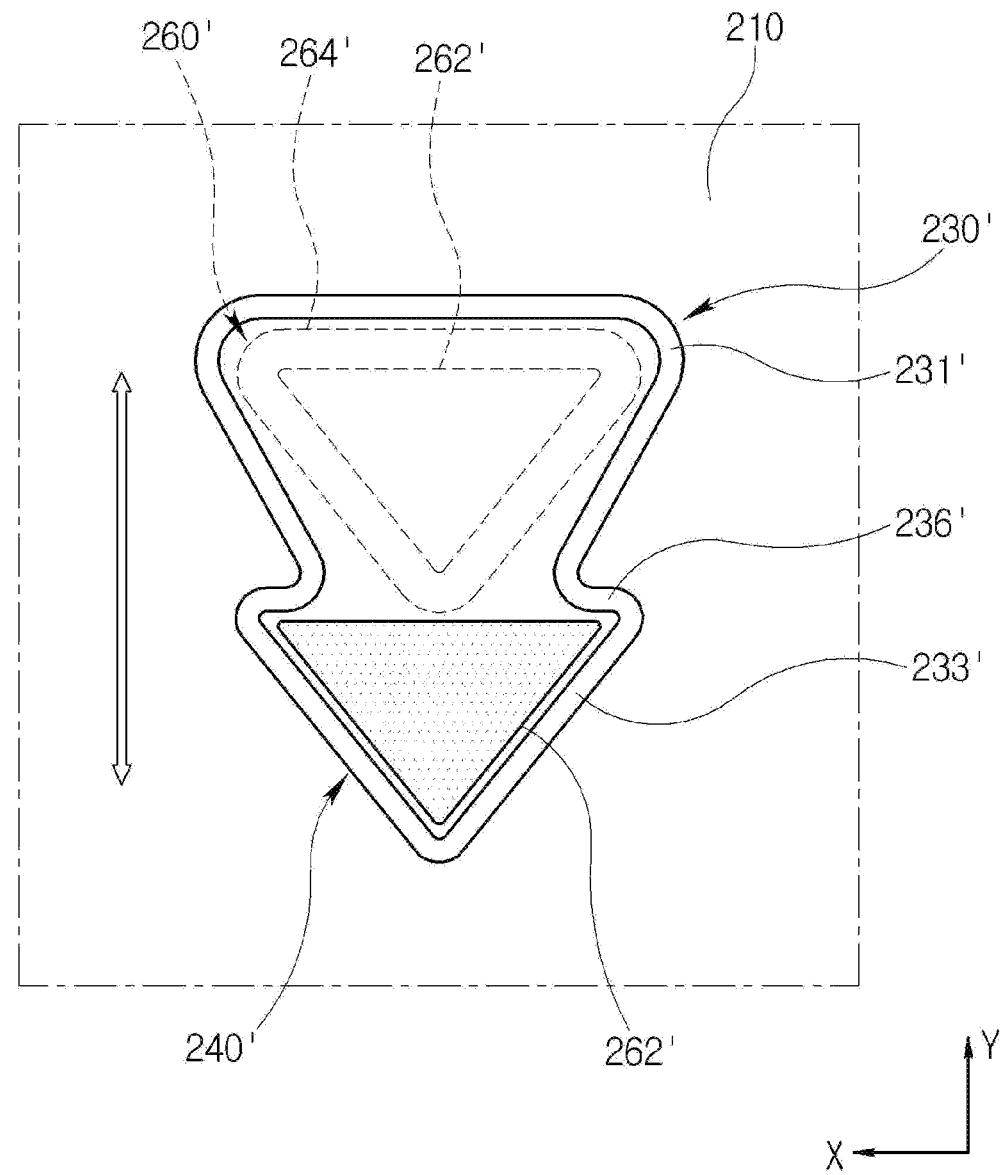
FIG. 10 is a plan view of a holder member according to another embodiment of the disclosure.
Figure 11:
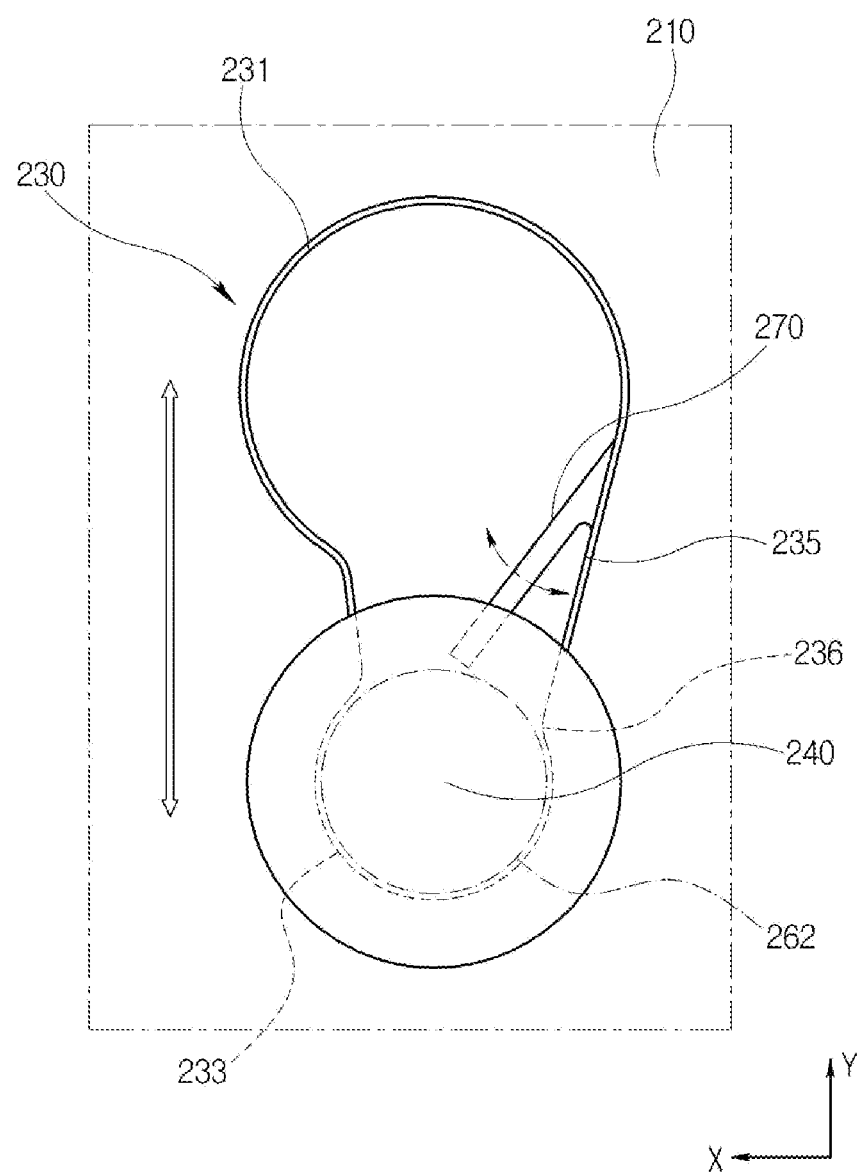
FIG. 11 is a plan view of a holder member according to still another embodiment of the disclosure.

FIGS. 9, 10 and 11 are plan views of a holder member according to embodiments of the disclosure.

Referring to FIG. 6B, the insertion hole 231 is disposed in the holder frame 210 and allows the retaining protrusion 240 for holding the control printed circuit board 180 to the holder frame 210 to be inserted into the insertion hole 231. In addition, the retaining hole 233 is disposed in the holder frame 210 and extends from the insertion hole 231, and holds the retaining protrusion 240. In this case, the size of the retaining hole 233 may be smaller than that of the insertion hole 231 so that the retaining protrusion 240 is secured to the holder frame 210 within the retaining hole 233.

Further, a direction where the insertion hole 231 and the retaining hole 233 are arranged may correspond to a direction where the flat cable 185 connects the control printed circuit board 180 and the source printed circuit board 170.

Referring to FIG. 4, the flat cable 185 is disposed in the Y-axis direction while connecting the control printed circuit board 180 and the source printed circuit board 170.

Therefore, when the insertion hole 231 and the retaining hole 233 are arranged to extend in the Y-axis direction and the retaining protrusion 240 is inserted in the through hole 230 and moved downward into the retaining hole 233 and retained in the Z-axis direction (downward direction), the flat cable 185 stably connects the control printed circuit board 180 and the source printed circuit board 170 without being damaged.

If the insertion hole 231 and the retaining hole 233 are arranged in the X-axis direction, the control printed circuit board 180 needs to move from side to side in the X-axis direction so as to be held, thereby causing the flat cable 185 to move from side to side (in the X-axis direction) and be twisted or damaged.

Referring to FIGS. 9 to 11, the holding portion 236 is disposed between the insertion hole 231 and the retaining hole 233 and formed to protrude inwards. The holding portion 236 may be formed to be smaller than a recessed portion 262. The recessed portion 262 may be formed to be larger than the holding portion 236. The holding portion 236 may interfere with the movement of the recessed portion 262 from the retaining hole 233 toward the insertion hole 231.

Referring to FIG. 5A to 6B, the retaining protrusion 240 may be disposed in the control printed circuit board 180 and detachably mounted to the through hole 230.

The retaining protrusion 240 may include a first protrusion 250 and a second protrusion 260.

The first protrusion 250 has a first end that is connected to a bottom portion of the control printed circuit board 180 and has a second end that protrudes in a downward direction away from the control printed circuit board 180. In this case, the first protrusion 250 may include a coupling portion 252 at the first end that protrudes upwards. The coupling portion 252 may be fitted, welded, etc., to a hole formed in the control printed circuit board 180. According to an embodiment of the disclosure, the first protrusion 250 and the coupling portion 252 may be made of a metal material including iron, steel, or the like, and may be a non-flexible material.

The second protrusion 260 may be connected to the bottom of the first protrusion 250 and inserted in the through hole 230.

Referring to FIG. 6A, the second protrusion 260 according to an embodiment of the disclosure may include the recessed portion 262 and a bottom portion 264. That is, the second protrusion 260 has a first end that is connected to the second end (e.g., the bottom) of the first protrusion 250, a second end (e.g., the bottom protrusion 264) that is inserted in the through hole 230, and the recessed portion 262 that is between the first end and the second end.

The recessed portion 262 may be recessed inwards in the middle of the second protrusion 260. Thus, a width of the recessed portion 262 is less than a width of the remaining portions of the recessed portion 262. Further, the bottom portion 264 may be provided in the bottom of the second protrusion 260 and formed to be wider than the recessed portion 262.

Referring to FIG. 9, the recessed portion 262 may be formed to have a width corresponding to the retaining hole 233. Further, the bottom portion 264 is smaller than the insertion hole 231 but larger than the retaining hole 233.

According to an embodiment of the disclosure, the first and second protrusions 250 and 260 of the holder member 200 may be formed to have a circular cross-section. The cross-section of the first and second protrusions 250 and 260 according to embodiments of the disclosure may have various shapes such as a triangle shape, but is not limited thereto. A diameter $D_2$ of the recessed portion 262 may be the same as or slightly smaller than a diameter $L_2$ of the retaining hole 233. The diameter $D_2$ of the recessed portion 262 may correspond to the diameter $L_2$ of the retaining hole 233. This is to allow the recessed portion 262 to be inserted in the retaining hole 233.

The bottom portion 264 may be shaped corresponding to the shape of the insertion hole 231, and the recessed portion 262 may be shaped corresponding to the retaining hole 233.

A diameter $D_1$ of the bottom portion 264 may be smaller than a diameter $L_1$ of the insertion hole 231. This is to allow the bottom portion 264 to be smoothly inserted in the insertion hole 231. Further, the diameter $D_1$ of the bottom portion 264 may be larger than the diameter $L_2$ of the retaining hole 233. This is to make the bottom portion 264 interfere with the retaining hole 233 and prevent the control printed circuit board 180 from being separated from the holder frame 210 even though the control printed circuit board 180 is lifted upwards after the recessed portion 262 is inserted in the retaining hole 233. This is to couple the control printed circuit board 180 to the holder frame 210.

Referring to FIG. 6A, after the recessed portion 262 is inserted in the retaining hole 233, the control printed circuit board 180 is not separated from the holder frame 210 even though the control printed circuit board 180 is lifted upwards because the bottom portion 264 has a larger diameter than the recessed portion 262 and thus interferes with the retaining hole 233.

Referring to FIG. 7, the through holes 230 are disposed at four corners of the holder frame 210. Referring to FIG. 4, the retaining protrusions 240 are disposed at four corners of the control printed circuit board 180. In this way, the through holes 230 and the retaining protrusions 240 are respectively coupled to each other at a plurality of positions (corners, points or locations), and thus the control printed circuit board 180 is stably held in the holder frame 210.

With this structure, referring to FIGS. 5A and 5B, the retaining protrusion 240 is inserted in the through hole 230 so as to securely hold the control printed circuit board 180 during transportation or shorten a manufacturing process by excluding a process of holding the control printed circuit board 180. As the process is optimized, production energy is less consumed.

The first protrusion 250 of the retaining protrusion 240 may be made of iron, steel or the like metal material and coupled to the bottom of the control printed circuit board 180. The second protrusion 260 is connected to the bottom of the first protrusion 250. According to an embodiment of the disclosure, the second protrusion 260 may include a nonconductive flexible material such as rubber, silicon, and urethane, so that the control printed circuit board 180 can be easily coupled to the holder frame 210 and prevented from shaking. Thus, the second protrusion 260 can be considered a flexible portion of the retaining protrusion 240 in one embodiment.

When the recessed portion 262 has a corresponding size (e.g., width) to, for example, the same size as the retaining hole 233, the recessed portion 262 is inserted in the retaining hole 233 and then firmly pressed against the inner surface (e.g., edge) of the retaining hole 233 such that the recessed portion 262 is in contact with the inner surface of the retaining hole 233. Thus, after the recessed portion 262 is inserted in the retaining hole 233, the outer surface of the recessed portion 262 made of a flexible material is firmly in contact with the inner surface of the retaining hole 233. Accordingly, the retaining protrusion 240 is contact with at least a portion of the through hole 230 in which the retaining protrusion 240 is inserted.

As described above, the holding portion 236 protruding inwards to form a concave surface may be formed between the insertion hole 231 and the retaining hole 233, and the holding portion 236 may be smaller than the recessed portion 262. Therefore, the recessed portion 262 is flexible and thus is slightly compressed inwards while passing the holding portion 236, and returns to its original shape after passing the holding portion 236, thereby being inserted in the retaining hole 233. The holding portion 236 may prevent (interfere with) the movement of the recessed portion 262 from the retaining hole 233 to the insertion hole 231.

Further, the recessed portion 262 is nonconductive to prevent current from flowing between the control printed circuit board 180 and the holder frame 210.

In addition, the second protrusion 260 is made of a nonconductive flexible material to absorb shock and prevent noise even though vibration occurs and causes the control printed circuit board 180 to move when the recessed portion 262 is positioned inside the retaining hole 233. Of course, the recessed portion 262 is firmly in contact with the retaining hole 233, thereby offsetting the movement of the control printed circuit board 180.

Referring to FIGS. 5A and 5B, when the second protrusion 260 is inserted in the insertion hole 231, the bottom portion 264 is positioned inside the holder frame 210 and the recessed portion 262 is positioned in the insertion hole 231.

In addition, referring to FIGS. 6A and 6B, when a user grasps and moves the control printed circuit board 180 in a downward direction, the recessed portion 262 is moved toward the retaining hole 233. In this case, the bottom portion 264 is positioned below the retaining hole 233 inside the holder frame 210.

When the recessed portion 262 has the same size as the retaining hole 233, the recessed portion 262 may be firmly held in the retaining hole 233. Further, the retaining hole 233 is smaller than the bottom portion 264, and thus the control printed circuit board 180 is prevented from separating upwards.

FIG. 10 discloses another embodiment of the holder member 200.

Referring to FIG. 10, an insertion hole 231' and a retaining hole 233' of a through hole 230', and a bottom portion 264' and a recessed portion 262' of a second protrusion 260' may have a triangle (or tree)-shaped cross-section. The insertion hole 231' and the retaining hole 233' of the through hole 230', and the bottom portion 264' and the recessed portion 262' of the second protrusion 260' may have various cross-sectional shapes such as a circle, and a triangle, and embodiments of the disclosure are not limited thereto.

Repetitive descriptions to the foregoing embodiments of the disclosure will be omitted.

Further, the insertion hole 231' may be formed to be larger than the retaining hole 233'. In this case, the bottom portion 264' may be formed to be smaller than the insertion hole 231' and larger than the retaining hole 233'.

The size of the recessed portion 262' may correspond to the size of the retaining hole 233'. For example, the size of the recessed portion 262' may be the same as or slightly smaller than the size of the retaining hole 233'.

Like the embodiment of FIG. 9, a user moves the control printed circuit board 180 in a downward direction and inserts the bottom portion 264' and the recessed portion 262' in the insertion hole 231'. Because the bottom portion 264' having a triangular shape is smaller than the insertion hole 231' having a triangular shape, the bottom portion 264' is smoothly inserted in the insertion hole 231' and positioned inside the holder frame 210.

Then, when a user moves the control printed circuit board 180 downwards in the Y-axis direction, the recessed portion 262' is moved to and inserted in the retaining hole 233'. As described above, the recessed portion 262' is made of rubber, urethane, silicon, or the like flexible material, and thus passes through a holding portion 236' formed between the insertion hole 231' and the retaining hole 233'. In other words, opposite edges of the recessed portion 262' having a triangular shape are folded to pass the holding portion 236'.

After the recessed portion 262' passes the holding portion 236', the opposite edges of the recessed portion 262' having a triangular shape are unfolded to its original shape and caught in (e.g., connected to) the holding portion 236', thereby preventing the recessed portion 262' from moving from the retaining hole 233' back to the insertion hole 231'. The recessed portion 262' having the triangular shape is caught in the holding portion 236' and retained in position inside the retaining hole 233'.

As described above, the holder member 200 according to this embodiment stably holds the control printed circuit board 180 like that of the previous embodiment even though the through hole 230' and the second protrusion 260' have a triangular shape.

Meanwhile, FIG. 11 discloses still another embodiment of the holder member 200.

Referring to FIG. 11, the holder member 200 according to this embodiment of the disclosure may further include a tapered portion 235 and a clip 270 in addition to the insertion hole 231 and the retaining hole 233 of the through hole 230. In the embodiment shown in FIG. 11, the insertion hole 231, the retaining hole 233, the recessed portion 262 and the bottom portion 264 may have circular shapes like those of the embodiment shown in FIG. 9.

The tapered portion 235 may be disposed between the insertion hole 231 and the retaining hole 233, and may taper in a direction from the insertion hole 231 toward the retaining hole 233.

The clip 270 may be disposed between the insertion hole 231 and the retaining hole 233. The clip 270 may be resiliently bent in an inward direction of the holder frame 210 when the recessed portion 262 moves from the insertion hole 231 to the retaining hole 233, but resiliently stretched to come into contact with the surface of the recessed portion 262 after the recessed portion 262 is inserted in the retaining hole 233. For example, the clip 270 may contact-support the surface of the recessed portion 262 and prevent the recessed portion 262 from moving from the retaining hole 233 back to the insertion hole 231, thereby retaining the position of the recessed portion 262.

Meanwhile, the tapered portion 235 gradually becomes narrower in a direction from the insertion hole 231 toward the retaining hole 233. The size of the tapered portion 235 may be smaller than the diameter of the retaining hole 233 in the vicinity of the retaining hole 233. As described above, the recessed portion 262 is made of rubber, silicon, urethane or the like flexible material, and passes the tapered portion 235 while being compressed inwards.

The recessed portion 262 is then contact-supported by the clip 270 and thus prevented from separating from the retaining hole 233. Further, the holding portion 236 is formed to be smaller than the recessed portion 262 and also serves to prevent the separation of the recessed portion 262.

With this structure, the holder member 200 according to an embodiment of the disclosure stably holds the control printed circuit board 180.

The display apparatus according to the disclosure is as follows.

According to an embodiment of the disclosure, a display apparatus may include a display panel; a heat dissipation plate disposed on a rear of the display panel; a source printed circuit board disposed on a rear of the heat dissipation plate, and connected to the display panel by a flexible circuit board; a control printed circuit board disposed on the rear of the heat dissipation plate, connected to the source printed circuit board by a flat cable, and including a retaining protrusion; and a holder member disposed between the heat dissipation plate and the control printed circuit board, and formed with a through hole through which the retaining protrusion passes.

According to some embodiments of the disclosure, the holder member may include a holder frame disposed on the rear of the heat dissipation plate and including the through hole.

According to some embodiments of the disclosure, the through hole may include: an insertion hole disposed in the holder frame and allowing the retaining protrusion to be inserted therein; a retaining hole disposed in the holder frame, communicating with the insertion hole, and retaining the retaining protrusion; and a holding portion disposed between the insertion hole and the retaining hole and protruding inwards.

According to some embodiments of the disclosure, the retaining hole may be smaller than the insertion hole.

According to some embodiments of the disclosure, the retaining protrusion may include: a first protrusion connected to a lower portion of the control printed circuit board and protruding in a downward direction; and a second protrusion connected to a lower portion of the first protrusion and inserted in the through hole.

According to some embodiments of the disclosure, the second protrusion may include: a recessed portion recessed inwards in a middle portion of the second protrusion; and a bottom portion formed to be larger than the recessed portion in the bottom of the second protrusion.

According to some embodiments of the disclosure, the recessed portion may be formed to have a size corresponding to the retaining hole, and the recessed portion may be formed to be larger than the holding portion.

According to some embodiments of the disclosure, the bottom portion may be formed to be smaller than the insertion hole and larger than the retaining hole.

According to some embodiments of the disclosure, the bottom portion may be shaped corresponding to the insertion hole, and the recessed portion may be shaped corresponding to the retaining hole.

According to some embodiments of the disclosure, the insertion hole and the retaining hole may have a circular shape, the bottom portion and the recessed portion may have a circular shape, the bottom portion may have a smaller diameter than the insertion hole but a larger than the retaining hole, and the recessed portion may have a diameter corresponding to the retaining hole.

According to some embodiments of the disclosure, the insertion hole and the retaining hole may have a triangular shape, the bottom portion and the recessed portion may have a triangular shape, the bottom portion may be smaller than the insertion hole but larger than the retaining hole, and the recessed portion may have a size corresponding to the retaining hole.

According to some embodiments of the disclosure, the recessed portion having the triangular shape may be caught in the holding portion and retained in position inside the retaining hole.

According to some embodiments of the disclosure, the through hole may be disposed between the insertion hole and the retaining hole, and include a tapered portion gradually decreased in size in a direction from the insertion hole toward the retaining hole.

According to some embodiments of the disclosure, the display apparatus may further include a clip disposed between the insertion hole and the retaining hole, wherein the clip is resiliently bent while the recessed portion is moving from the insertion hole to the retaining hole, and resiliently stretched to come into contact with the recessed portion and retain the position of the recessed portion after the recessed portion is inserted in the retaining hole.

According to some embodiments of the disclosure, a direction where the insertion hole and the retaining hole are arranged may correspond to a direction where the flat cable connects the control printed circuit board and the source printed circuit board.

According to some embodiments of the disclosure, the first protrusion may include a nonflexible material, and the second protrusion may include a nonconductive flexible material.

According to some embodiments of the disclosure, the holder member may include an opening formed penetrating an area of the holder frame corresponding to the control printed circuit board, wherein heat generated in the control printed circuit board is dissipated through the opening.

The foregoing descriptions are merely a specific embodiment of the display apparatus.

Therefore, it is readily apparent to a person having ordinary knowledge in the art that various substitutions and modifications can be made without departing from the scope of the disclosure defined in the appended claims.

According to an embodiment of the disclosure, the display apparatus may be applicable to a mobile device, a video telephone, a smart watch, a watch phone, a wearable apparatus, a foldable apparatus, a rollable apparatus, a bendable apparatus, a flexible apparatus, a curved apparatus, a sliding apparatus, a variable apparatus, an electronic notebook an E-book, a portable multimedia player (PMP), a personal digital assistant (PDA), an MP3 player, a mobile medical device, a desktop personal computer (PC), a laptop PC, a netbook computer, a workstation, a navigation, an in-vehicle navigation, an in-vehicle display, an in-vehicle device, a theater device, a theater display, a television, a wallpaper device, a signage device, a game console, a laptop computer, a monitor, a camera, a camcorder, home appliances, etc.

Although a few embodiments have been described in more detail with reference to the accompanying drawings, the disclosure is not necessarily limited to such embodiments and may be variously modified without departing from the scope of the disclosure. Therefore, embodiments of the disclosure are intended to not limit but describe the technical spirit of the disclosure, and the scope of the disclosure is not limited by these embodiments. Accordingly, the embodiments described above should be understood to be illustrative and non-limiting in all respects. The scope of the disclosure should be construed by the appended claims, and all technical spirits within the equivalent scope fall in the scope of the disclosure.

| DESCRIPTION OF REFERENCE NUMERALS | |
|---|---|
| 100: display apparatus | |
| 101: cover member | 150: display panel |
| 160: heat dissipation plate | |
| 170: source printed circuit board | |
| 171: first connector | 175: flexible circuit board |
| 180: control printed circuit board | |
| 181: second connector | |
| 185: flat cable | 190: adhesive member |
| 200: holder member | 210: holder frame |
| 220: opening | 230, 230': through hole |
| 231, 231': insertion hole | 233, 233': retaining hole |
| 236, 236': holding portion | |
| 235: tapered portion | |
| 240, 240': retaining protrusion | |
| 250: first protrusion | |
| 252: coupling portion | 260, 260': second protrusion |
| 262, 262': recessed portion | 264, 264': bottom portion |
| 270: clip | |

What is claimed is:

1. A display apparatus comprising:
a display panel including a front surface and a rear surface that is opposite the front surface;
a heat dissipation plate including a front surface and a rear surface, the front surface of the heat dissipation plate on the rear surface of the display panel;
a source printed circuit board on the rear surface of the heat dissipation plate, the source printed circuit board connected to the display panel via a flexible circuit board;
a control printed circuit board on the rear surface of the heat dissipation plate and connected to the source printed circuit board via a flat cable, the control printed circuit board comprising a retaining protrusion that protrudes towards the rear surface of the display panel; and
a holder member between the heat dissipation plate and the control printed circuit board, the holder member comprising a holder frame on the rear surface of the heat dissipation plate and the holder frame including at least one through hole through which the retaining protrusion is inserted,
wherein the at least one through hole comprises:
an insertion hole in the holder frame;
a retaining hole in the holder frame; and
a holding portion between the insertion hole and the retaining hole, the holding portion having a width that is less than a width of the insertion hole and a width of the retaining hole,
wherein the retaining protrusion is configured to be inserted through the insertion hole and moved into the retaining hole through the holding portion.

2. The display apparatus of claim 1, wherein the at least one through hole includes a plurality of through holes at edges of the holder frame.

3. The display apparatus of claim 1, wherein the retaining hole is smaller than the insertion hole.

4. The display apparatus of claim 3, wherein the retaining protrusion comprises:
a first protrusion connected to a lower portion of the control printed circuit board, the first protrusion protruding in a downward direction away from the lower portion of the control printed circuit board; and
a second protrusion connected to a lower portion of the first protrusion, the second protrusion inserted in the retaining hole of the at least one through hole.

5. The display apparatus of claim 4, wherein the second protrusion comprises:
a bottom portion at a bottom end of the second protrusion; and
a recessed portion between the bottom portion of the second protrusion and the first protrusion, the recessed portion having a width that is less than a width of the bottom portion and a width of the first protrusion.

6. The display apparatus of claim 5, wherein the recessed portion has a size corresponding to a size of the retaining hole, and the size of the recessed portion is larger than a size of the holding portion.

7. The display apparatus of claim 6, wherein the recessed portion is flexible and is compressed while disposed in the holding portion such that the recessed portion has a size that is less than a size of the recessed portion while the recessed portion is inserted in the retaining hole.

8. The display apparatus of claim 6, wherein a size of the bottom portion is smaller than a size of the insertion hole and is larger than the size of the retaining hole.

9. The display apparatus of claim 8, wherein the bottom portion has a shape that corresponds to a shape of the insertion hole, and the recessed portion has a shape that corresponds to a shape of the retaining hole.

10. The display apparatus of claim 9, wherein the insertion hole, the retaining hole, the bottom portion, and the recessed portion have a circular shape,
wherein the bottom portion has a diameter that is smaller than a diameter of the insertion hole but larger than a diameter of the retaining hole, and the recessed portion has a diameter corresponding to the diameter of the retaining hole.

11. The display apparatus of claim 5, wherein the insertion hole, the retaining hole, the bottom portion, and the recessed portion have a triangular shape,
wherein a size of the bottom portion is smaller than a size of the insertion hole but larger than a size of the retaining hole, and a size of the recessed portion corresponds to the size of the retaining hole.

12. The display apparatus of claim 11, wherein the recessed portion having the triangular shape is connected to the holding portion and retained inside the retaining hole.

13. The display apparatus of claim 5, wherein the at least one through hole comprises a tapered portion that tapers in a direction from the insertion hole toward the retaining hole.

14. The display apparatus of claim 13, further comprising:
a clip disposed between the insertion hole and the retaining hole,
wherein the clip is configured to be bent while the recessed portion moves from the insertion hole to the retaining hole, and contacts the recessed portion to retain a position of the recessed portion while the recessed portion is in the retaining hole.

15. The display apparatus of claim 1, wherein a direction in which the insertion hole and the retaining hole extend corresponds to a direction in which the flat cable extends to connect the control printed circuit board and the source printed circuit board.

16. The display apparatus of claim 4, wherein the first protrusion comprises a non-flexible material, and the second protrusion comprises a non-conductive flexible material.

17. The display apparatus of claim 1, wherein the holder member comprises an opening through an entire thickness of an area of the holder frame corresponding to the control printed circuit board.

18. A display apparatus comprising:
a display panel including a front surface and a rear surface that is opposite the front surface;
a heat dissipation plate including a front surface and a rear surface and the front surface of the heat dissipation plate is on the rear surface of the display panel, the heat dissipation plate configured to dissipate heat from the display panel;
a holder frame on the heat dissipation plate, the holder frame including a plurality of through holes; and
a control printed circuit board on the holder frame, the control printed circuit board including a plurality of retaining protrusions that are each inserted into a corresponding through hole from the plurality of through holes and in contact with at least a portion of the corresponding through hole such that the control printed circuit board is connected to the holder frame;
wherein each of the plurality of through holes comprises:
an insertion hole in the holder frame;
a retaining hole in the holder frame having a width that is wider than a width of the insertion hole; and
a holding portion between the insertion hole and the retaining hole, the holding portion having a width that is less than the width of the insertion hole and the width of the retaining hole,
wherein each retaining protrusion is configured to be inserted through the insertion hole of the corresponding through hole and moved into the retaining hole of the corresponding through hole through the holding portion of the corresponding through hole.

19. The display apparatus of claim 18, wherein each of the plurality of retaining protrusions comprises:
a flexible portion having a first end, a second end, and a recessed portion between the first end and the second end of the flexible portion, the recessed portion having a width that is less than a width of the first end and a width of the second end.

20. The display apparatus of claim 19, wherein the width of the recessed portion is a same as the width of the retaining hole such that the recessed portion is in contact with an edge of the retaining hole while the retaining protrusion is in the retaining hole, and the width of the second end of the flexible portion is wider than the width of the retaining hole.

21. The display apparatus of claim 19, wherein the width of the recessed portion is wider than the width of the holding portion,
wherein the recessed portion is compressed while in the holding portion such that the width of the recessed portion is less than the width of the recessed portion while the recessed portion is inserted in the retaining hole.

22. The display apparatus of claim 18, wherein the holder frame includes an opening through an entire thickness of the holder frame and the control printed circuit board overlaps the opening.

* * * * *